United States Patent [19]

Hansen

[11] Patent Number: 4,584,710
[45] Date of Patent: Apr. 22, 1986

[54] COHERENT RECEIVER PHASE AND AMPLITUDE ALIGNMENT CIRCUIT

[75] Inventor: James P. Hansen, Fairfax, Va.

[73] Assignee: The United States of America as represented by the Secretary of the Navy, Washington, D.C.

[21] Appl. No.: 670,082

[22] Filed: Nov. 13, 1984

[51] Int. Cl.$^4$ .................. H04B 17/00; H04B 1/16; G01S 7/40

[52] U.S. Cl. .................. 455/226; 455/265; 455/304; 343/17.7; 375/97; 324/83 D

[58] Field of Search .............. 343/17.7, 5 NQ; 455/226, 146, 203, 304, 265; 375/10, 77, 97; 324/83 D

[56] References Cited

U.S. PATENT DOCUMENTS

| | | | |
|---|---|---|---|
| 3,263,228 | 7/1966 | Abrahams et al. | 343/17.7 |
| 3,594,638 | 7/1971 | Quint | 324/85 |
| 3,669,511 | 9/1970 | Motley et al. | 375/77 |
| 3,701,948 | 10/1972 | McAuliffe | 375/77 |
| 3,895,294 | 7/1975 | Vinding | 324/83 D |
| 4,204,165 | 5/1980 | Ready | 455/226 |
| 4,285,060 | 8/1981 | Cobb et al. | 455/304 |
| 4,479,253 | 10/1984 | Daniel, Jr. | 455/226 |

Primary Examiner—Jin F. Ng
Assistant Examiner—Elissa Seidenglanz
Attorney, Agent, or Firm—Robert F. Beers; William T. Ellis

[57] ABSTRACT

A device for aligning the phase and amplitude of a quadrature-detected coherent two-channel receiver utilizing a mixer in each channel comprising a circuit for providing a sweep frequency signal to each receiver channel; a circuit for detecting the envelopes of the receiver channels at the outputs of the mixers and determining the voltage difference between the envelopes; and a circuit for controlling the amplitude level in one of the receiver channels in accordance with this voltage difference. Simultaneously, the output signals from the two mixers are added with the resulting sum signal being envelope-detected, and also subtracted from each other with the resulting difference signal being envelope-detected. The sum envelope and the difference envelope are subtracted from each other to generate a control signal for controlling the phase of one of the mixer local oscillator signals to ensure that the mixer local oscillator signals are in phase quadrature.

10 Claims, 5 Drawing Figures

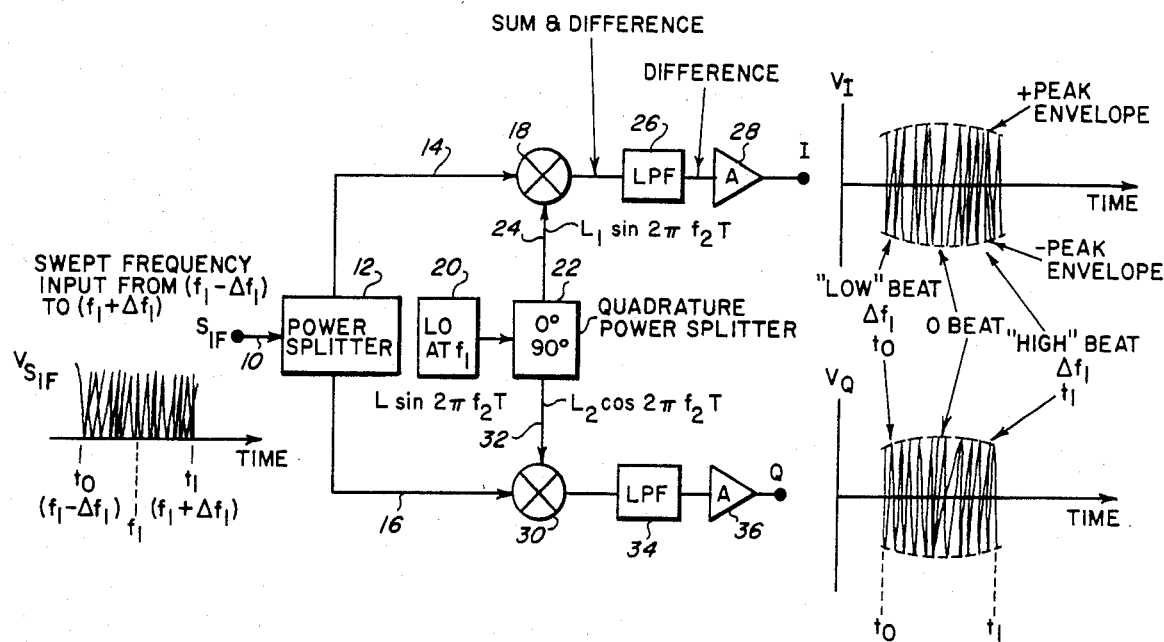
*FIG. 1*
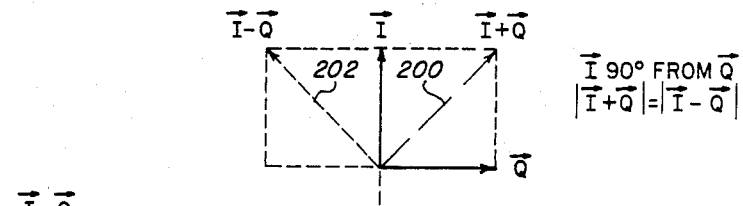
*FIG. 2a*
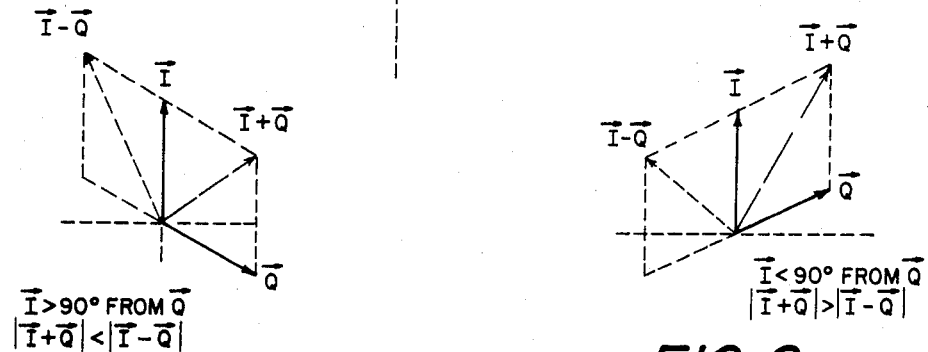
*FIG. 2b*  *FIG. 2c*
QUADRATURE PHASE DISCRIMINATION BY ADDITION AND SUBTRACTION OF VECTORS

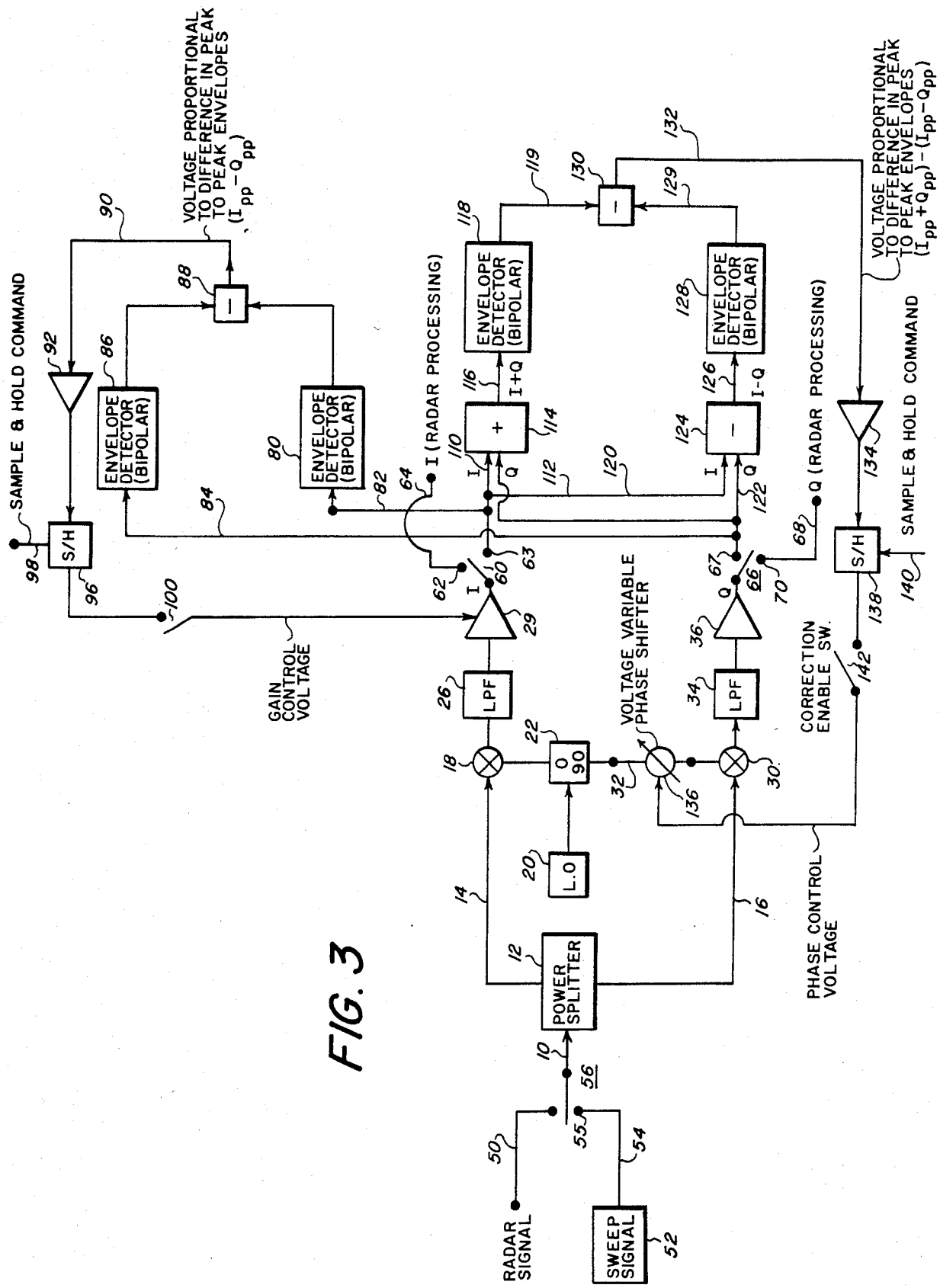

COHERENT RECEIVER PHASE AND AMPLITUDE ALIGNMENT CIRCUIT

BACKGROUND OF THE INVENTION

The present invention relates generally to coherent receiver signal matching, and more particularly, to the self alignment of the relative phase and amplitude of two coherent receivers.

Matched coherent receiver channels are often required in radar and communications work in order to compare responses from different sensors or to coherently downshift in frequency and detect signal components. For example, two receiver channels of a coherent quadrature detector system (sometimes called a single sideband demodulator) are typically used to frequency translate signals received within a nominal I.F. frequency band down to two separate baseband signal components which together contain the original signal's phase and amplitude information.

If it is assumed that the input I.F. signal is a sinewave represented by $S_{I.F.} = A \cos (2\pi f_1 T + \theta)$, then a quadrature detector circuit with a local oscillator input of $S_{L.O.} = L \sin 2\pi f_2 T$ will produce the signal components represented as $$I = \alpha_I A \sin [2\pi(f_1 - f_2) T + \phi_I + \theta]$$

$$Q = \alpha_Q A \cos [2\pi(f_1 + f_2) T + \phi_Q + \theta],$$

with the $\alpha$ terms representing circuit gain or attenuation values and the $\phi$ terms representing circuit phase shift and delay terms. For the ideal matched case, $\alpha_I = \alpha_Q = \alpha$ and $\phi_I = \phi_Q = \phi$ such that $$I = -\alpha A \sin [2\pi(f_1 - f_2) T + \phi + \theta]$$

$$Q = \alpha A \cos [2\pi(f_1 - f_2) T + \phi + \theta]$$

The desired amplitude A of the signal may be found by the following equation:

$$\alpha A = (I^2 + Q^2)^{\frac{1}{2}}.$$

Likewise, the phase of the I.F. signal may be calculated by the following equation:

$$2\pi(f_1 - f_2) T + \phi + \theta = TAN^{-1} I/Q.$$

Note that any mismatches in overall amplitude or phase delay between the two quadrature channels will perturb the expected amplitude $(I^2 + Q^2)^{\frac{1}{2}}$ and phase relationship $TAN^{-1}$ I/Q between input and output parameters. If the relative mismatch changes with input frequency, a distortion becomes apparent for cases of multi-frequency (wideband) input signals.

Conventional approaches to characterizing and aligning the channel responses for such quadrature detectors involve making many multipoint measurements of I and Q for a wide range of calibrated phase shifts of a single frequency input and then repeating these measurements for each frequency contained in the expected input bandwidth. The measurements are usually tabulated, related mathematically to the input signal, and then the components are manually tuned to correct for misalignment of phase and/or amplitude. Measurement and alignment are obviously complicated by the fact that a change in output amplitude of either I or Q at a given frequency may be caused by changes in either phase or amplitude or both in view of the amplitude $(I^2 + Q^2)^{\frac{1}{2}}$ and phase $TAN^{-1}$ I/Q relationships noted previously.

OBJECTS OF THE INVENTION

Accordingly, it is an object of the present invention to independently measure and correct the relative amplitude and phase responses between two coherent receiver channels.

It is a further object of the present invention to align the amplitude and phase responses of coherent receivers which have a common local oscillator signal without the use of a calibrated phase shifting unit at the input ports.

It is yet a further object of the present invention to automatically correct for gain match and for phase match by utilizing error voltages which can be sampled at selected points in the frequency band or averaged over the entire frequency band.

Other objects, advantages, and novel features of the present invention will become apparent from the detailed description of the invention, which follows the summary.

SUMMARY OF THE INVENTION

Briefly, the above and other objects are realized by a circuit for aligning the phase and amplitude of a first and second coherent receiver channels, with said first receiver channel including a first mixer for mixing a first channel signal with a first local oscillator signal, and with said second receiver including a second mixer for mixing a second channel signal with a second local oscillator signal which is approximately 90° out of phase with said first local oscillator signal, comprising:

means for applying a sweep signal to each of the receiver channels, with the sweep signal sweeping across a frequency band of interest;

a first envelope detector for detecting the signal envelope at the output of the first mixer in the first receiver channel;

a second envelope detector for detecting the signal envelope at the output of the second mixer in the second receiver channel;

first means for subtracting the envelopes detected by the first and second envelope detectors from each other and generating a first control signals;

means for controlling the amplitude level of one of the receiver channels in accordance with the first control signal;

means for adding the signals from the mixers in the first and second receiver channels;

a third envelope detector for detecting the envelope of the signal from the adding means:

second means for subtracting the signals from the mixers in the first and second receiver channels;

a fourth envelope detector for detecting the envelope of the signal from the second subtracting means;

third means for subtracting the envelopes detected by the third and fourth envelope detectors from each other and generating a second control signal in accordance therewith; and means for controlling the phase of one of the local oscillator signals in accordance with the second control signal to ensure that the local oscillator signals are in phase quadrature.

BRIEF DESCRIPTION OF THE DRAWINGS

FIG. 1 is a schematic block diagram of a basic quadrature detector.

FIGS. 2a, 2b, and 2c are schematic diagrams showing the addition and subtraction of I and Q vectors.

FIG. 3 is a schematic block diagram of one embodiment of the present invention.

DETAIL DESCRIPTION OF THE PREFERRED EMBODIMENT

The present invention is directed to a circuit for automatically aligning the amplitude and phase responses of coherent receivers which either have a common local oscillator signal (such as a quadrature detector), or have a local oscillator signal which is properly synchronized. The alignment is performed in two distinct processes which separate amplitude and phase effects.

FIG. 1 sets forth the typical components found in a coherent receiver system having two channels with a common local oscillator signal. The input signal, typically an intermediate frequency (IF) signal, is applied on line 10 to a power splitter 12. The power splitter 12 applies approximately half the power of the IF signal to a first channel 14 and the other half of the signal to a second channel 16. The IF signal on the first channel 14 is applied to one input of a mixer 18. A local oscillator signal at a frequency $f_2$ is generated by a local oscillator generator 20 and applied through a quadrature power splitter 22 and the line 24 to a second input of the mixer 18. In the embodiment shown in FIG. 1, the local oscillator signal applied on line 24 to the mixer is taken from the zero degree port of the quadrature power splitter 22. The result of mixing the IF signal and the local oscillator signal in the mixer 18 is the sum and difference signals and various harmonics thereof. A low pass filter 26 is utilized to filter out the sum signal and pass only the low frequency difference signal. This signal is amplified in the amplifier 28 and constitutes the I signal.

Likewise, in the second channel 16, the IF signal is applied to one input port of a mixer 30. A quadrature local oscillator signal from the quadrature port of the quadrature power splitter 22 is applied to the second input port of the mixer 30 via the line 32. Again, the mixing of the IF signal and the local oscillator signal results in a sum and difference signals and various harmonics thereof. A low pass filter 34 is utilized to remove the sum signal and all of the harmonics and only pass the low frequency difference signal. The difference signal is amplified in the amplifier 36 and constitutes the Q signal.

It is desired to determine the gain difference between the first and second channels 14 and 16, and then to compensate for that gain difference. In the present invention this gain difference is determined by measuring the relative amplitude response across a band of input frequencies. This amplitude response measurement is accomplished by simply frequency sweeping an input sinewave and determining the maximum envelope, or peak-to-peak response, of each channel output. This peak-to-peak response for the first and second channels 14 and 16 is shown in FIG. 1. The frequency sweep should be over a desired band of frequencies. Typically, this frequency band will straddle the local oscillator frequency, i.e., the local oscillator frequency will be in the center of the band. This location of the local oscillator frequency is convenient in order to facilitate signal folding, i e., baseband detection. Note however that the local oscillator frequency is not restricted to a location in the center of the sweep frequency band. The sweep signal is merely to sweep out the passband of interest for the receiver.

Since no information regarding the precise phase of the incoming of IF signal is available, it is generally desired to provide a full cycle (360° of phase change) of the difference frequency or beat frequency $f_1-f_2$, at each frequency of interest in the input frequency band. This full cycle for each frequency will ensure that a maximum response has been traced out for that particular frequency in each channel. This 360° phase change is obtained by changing the frequency continuously. In order to ensure that a full cycle is traced out for the majority of frequencies of interest in the band, the bandwidth or sweep speed for the sweep frequency signal should be less than the bandwidth of the coherent receiver. Typically, the bandwidth of the sweep frequency should be no faster than a factor of 10 lower than the bandwidth of the coherent receiver.

In the simple case, the swept input signal dwells sufficiently long at each frequency $f_1 \neq f_2$ to produce a full "beat" cycle of each difference frequency $f_1-f_2$. When a full beat cycle is traced out for a given difference frequency, the full amplitude response, independent of phase, is obtained. Therefore, the relative amplitude response with input frequency of the two channels can be compared by comparing the maximum peak-to-peak envelopes as the input signal is swept through the band of interest.

For the normal situation where the local oscillator frequency is centered in the input band, the difference frequency outputs $(f_1-f_2)$ are beat signals which have a maximum frequency at the two edges of the band, and a zero "beat" at the center crossing where the input frequency $f_1$ momentarily equals the local oscillator frequency $f_2$. Accordingly, it can be seen that if the input frequency is continuously swept, the amplitude response will be generally traced out for the regions where the instantaneous beat frequency is greater than or comparable to the rate of the sweep. Note that only the region near the low frequency zero beat will not contain the full amplitude response because there is not enough time to trace out a full 360° cycle because this frequency is too low. The difference frequency response with low and high beat frequencies and the zero beat frequency are illustrated in the signal drawings in FIG. 1. Note that there should be at least one cycle of 360° in order to ensure that a maximum signal is obtained at each frequency of interest except at frequencies close to the zero beat frequency. Clearly the system could also be designed to trace out more than one cycle of the signal at each frequency.

FIG. 3 discloses one embodiment for comparing the peak-to-peak envelopes of the I and Q signals. The circuit set forth in FIG. 3 is shown in the context of a radar system wherein a radar signal is applied on a line 50. A calibration sweep signal may be generated in a sweep signal generator 52 and applied via a line 54 to one pole of a two pole switch 56. The radar signal is applied to the second pole of the switch 56. The switch 56 is connected to the input line 10 for the power splitter 12 noted in FIG. 1. The first channel 14 again includes the mixer 18, the low pass filter 26, and an amplifier 29. The second channel 16 includes the mixer 30, the low pass filter 34, and the amplifier 36. A local oscillator signal generator 20 again applies quadrature local oscillator signals via a quadrature power splitter 22 to inputs on the mixers 18 and 30. The I signal is normally applied through a switch 60 to further radar processing circuits on line 64 via the switch pole 62. Likewise, the Q signal is applied through a switch 66 to further radar processing circuits on the line 68 via the switch pole 70.

In the calibration mode, the switch 56 is operated to connect to the pole 55 to apply the sweep signal from the sweep signal generator 52 to the input line 10. Likewise, the switches 60 and 66 are switched to a switch pole 63 and a switch pole 67, respectively, to apply the I and Q signals to the amplitude and phase calibration circuitry.

As noted previously, the peak-to-peak beat envelopes of the two channels 14 and 16 represent their amplitude responses with input frequency. Thus, for such a swept frequency input, the I and Q envelopes can be compared with the aid of peak detecting and holding circuits (analog or digital) which hold each positive and negative peak signal until the next peak signal. In the embodiment of FIG. 3, the I envelope is detected by a bipolar envelope detector 80 which obtains its signal via the line 82. Likewise, the Q envelope is detected via bipolar envelope detector 86 via the line 84. The amplitude differences between these I and Q receiver channels are detected by simply subtracting the absolute values of the peak-to-peak voltage ranges in a subtractor 88. The resulting voltage output from the subtractor 88 is proportional to the difference in the peak-to-peak envelopes $I_{pp}-Q_{pp}$. This difference voltage output from the subtractor 88 is applied via the line 90 in a feedback loop to an amplitude controlling element in one of the channels 14 or 16. In the embodiment shown in FIG. 3, this voltage difference signal on line 90, which comprises a first control signal, is applied via amplifier 92 to control the gain on the channel amplifier 29 in the first channel 14. This feedback circuit is a form of AGC control and may be applied to either one or both channel amplifiers. It should also be noted that this amplitude control may also be affected by means of attenuators.

For a given application, there may only be interest in a correct circuit response for one predetermined frequency. Accordingly, it may be desirable to calibrate the system only in accordance with the circuit response at this predetermined frequency. Thus, when the sweep frequency reaches this predetermined frequency, the feedback loop may be designed to sample and hold this particular feedback correction response. This sample and hold function is implemented in FIG. 3 by the S/H block 96 which is controlled by a timing signal on line 98. The timing signal is timed to the input frequency sweep range. A switch 100 is than utilized to apply the sampled first control signal held in the S/H block 96 to control the amplifier 29. In the more general case, the first control signal is simply averaged over the frequency sweep and applied to control the gain of the amplifier 29 without the use of the sample and hold block 96.

As previously noted, it is also desirable to align the phases of the I and Q signals in the first and second channels. The relative phase response across the band of input frequencies can be compared by first setting the phases of the common local oscillator signals such that the relative mixing response in the two channels is approximately 90° in or out of phase. This quadrature relationship for the local oscillator signals is the normal situation for a quadrature detector, but also can be achieved with any two down-converting receivers using a common oscillator, given phase control of one local oscillator input. Accordingly, the down-converted output "beat" signals resulting from the shared local oscillator quadrature signals are 90° out of-phase (one varies as the sine and one varies as the cosine). These I and Q outputs can be represented as two vectors 90° out of phase. These out-of-phase vectors are shown in FIG. 2a. It is known from standard phase discriminator theory and practice (*Information Transmission, Modulation and Noise*, by M. Schwartz, McGraw-Hill 1959, pages 114–115) that the coherent sum and the coherent difference of two such vectors combine to the same maximum magnitude only for the case of exact phase quadrature. This relationship is shown in FIG. 2a wherein the dash-line vector 200 represents the $\overline{I+Q}$ vector and the dash-line vector 202 represents the vector $\overline{I-Q}$. FIG. 2b shows the $\overline{I-Q}$ and $\overline{I+Q}$ vectors with I greater than 90° from $\overline{Q}$. FIG. 2c shows the $\overline{I-Q}$ and $\overline{I+Q}$ vectors for I less than 90° from $\overline{Q}$. The above-described discriminator relationship means that if the I and Q outputs are coherently summed and differenced, and than these two combinations are once again compared for maximum peak-to-peak envelopes as the input frequency is swept through the desired band, the envelope of the sum and the envelope of the difference will have the same peak-to-peak magnitudes only at the input frequencies where the relative 90° phase relationship has been maintained. This equality does not depend on an amplitude match between the two channels.

A phase alignment based on the above-described sum and difference magnitude relationship is shown in FIG. 3. The I+Q sum magnitude is obtained by applying the I signal on line 110 and the Q signal on line 112 to a summer 114. This sum signal I+Q is applied via the line 116 to a circuit 118 for detecting the peak magnitudes of the signal. Again, this peak magnitude detecting circuit may be an analog or digital device. In FIG. 3, the peak detecting circuit 118 is implemented by a bipolar envelope detector.

Likewise, the difference signal I−Q is obtained by applying the I signal on line 120 and the Q signal on line 122 to a subtractor circuit 124. The resulting I−Q difference signal is applied via the line 126 to a second bipolar envelope detector 128 for detecting the peak magnitude of the signal.

The output from the envelope detector 118 is a voltage proportional to the peak-to peak envelope of the I+Q sum. Likewise, the output from the envelope detector 128 is a voltage proportional to the peak-to-peak envelope of the I−Q difference. These sum and difference envelope outputs are applied via the lines 119 and 129, respectively, to a subtractor 130 which operates to subtract the sum and difference envelopes, one from the other. The output difference signal from the subtractor 130 is a voltage on line 132 proportional to the difference in the peak-to-peak sum and difference envelopes. The difference signal is applied via an amplifier 134 to control a voltage variable phase shifter 136 disposed in one of local oscillator lines feeding the mixers 18 and 30. In the embodiment shown in FIG. 3, the voltage varible phase shifter 136 is disposed in the line 32 feeding the local oscillator signal to an input of the mixer 30. This signal on line 132 constitutes a second control signal for adjusting the phase to provide a correction for overall quadrature.

As with the amplitude correction circuitry discussed previously, the predetermined frequency point of interest for obtaining a phase match can be selected by means of a sample and hold circuit S/H 138. Again, this sample and hold circuit 138 may be timed relative to the input frequency sweep via a timing line 140. A switch 142 may than be utilized to apply this second control signal to the voltage variable phase shifter 136. In the more general case, the second control signal for controlling the phase match can be averaged over the full frequency sweep.

The switches 60 and 66 were included in the present system because generally it is not desirable to have the sweep calibration signal go into the later radar processing circuitry. Accordingly, the switches 60 and 66 are normally ganged with the switch 56. However, if the calibration signal in the later processing circuitry is not a problem, then the switches 60 and 66 could simply be replaced by power splitters.

The foregoing circuit is capable of independently measuring and correcting the relative amplitude and phase responses between two coherent receiver channels by detecting the changes in the signal envelopes at the receiver outputs for a swept frequency input. Since a fixed input phase is not required, a measurement and correction of a given coherent receiver circuit does not require a calibrated phase shifting unit at the input ports, and the entire input bandwidth may be tested within one sweep of the frequency band. The automatic correction for gain match and for phase match is implemented by utilizing error voltages which can be sampled at selected points in the frequency band or averaged over the total band.

In addition to aligning two coherent receivers, the present technique can also be used to compare the amplitude and phase match of two passive elements, simply by inserting those elements at the input ports of two correction instrumented (calibrated) quadrature receivers, and then observing the changes in the error voltages of the self correction circuits. This same type of comparison can also be performed at the lower baseband frequencies by inserting the elements to be tested in the I, Q output legs and then retesting.

It should be noted that both the phase and the amplitude alignment in the circuit may be performed simultaneously, or one after the other.

Additionally, it should be noted that if the present circuit is provided with a very large or unlimited bandwidth, than there will be no limitation on the sweep speed as long as the sweep is continuous.

The basic limitation on the frequency sweep signal (assuming a limited bandwidth circuit) is that there be only one frequency component in the circuit at a time. Additionally, the frequency sweep should have a bandwidth which is less than the coherent receiver bandwidth in order to ensure that most of the frequencies in the bandwidth have a full cycle thereof traced out. It should be noted that this frequency sweep may be implemented, in some applications, by means of a radar chirp signal. Accordingly, a separate calibration sweep signal may not be needed for chirp radar systems.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States:

1. A circuit for aligning the phase and amplitude of a first and second coherent receiver channels, with said first receiver channel including a first mixer for mixing a first channel signal with a first local oscillator signal, and with said second receiver channel including a second mixer for mixing a second channel signal with a second local oscillator signal which is approximately 90° out of phase with said first local oscillator signal, comprising:

means for applying a sweep signal to each of said receiver channels, with said sweep signal sweeping across a frequency band of interest;

means for comparing the output signals from said mixers and generating a first control signal in accordance therewith;

means for controlling the amplitude level of one of said receiver channels in accordance with said control signal;

means for adding the signals from said mixers to obtain a sum signal;

means for subtracting the signals from said mixers from each other to obtain a difference signal;

means for comparing said sum signal and said difference signal and generating a second control signal in accordance therewith; and means for controlling the phase of one of the local oscillator signals in accordance with said second control signal to ensure that the local oscillator signals are in phase quadrature.

2. A circuit for aligning the phase and amplitude of a first and second coherent receiver channels, with said first receiver channel including a first mixer for mixing a first channel signal with a first local oscillator signal, and with said second receiver channel including a second mixer for mixing a second channel signal with a second local oscillator signal which is approximately 90° out of phase with said first local oscillator signal, comprising:

means for applying a sweep signal to each of said receiver channels, with said sweep signal sweeping across a frequency band of interest;

a first envelope detector for detecting the signal envelope at the output of said first mixer in said first receiver channel;

a second envelope detector for detecting the signal envelope at the output of said second mixer in said second receiver channel:

first means for subtracting the envelopes detected by said first and second envelope detectors from each other and generating a first control signal;

means for controlling the amplitude level of one of said receiver channels in accordance with said first control signal;

means for adding the signals from the mixers in said first and second receiver channels;

a third envelope detector for detecting the envelope of the signal from said adding means;

second means for subtracting the signals from the mixers in said first and second receiver channels:

a fourth envelope detector for detecting the envelope of the signal from said second subtracting means;

third means for subtracting the envelopes detected by said third and fourth envelope detectors from each other and generating a second control signal in accordance therewith; and means for controlling the phase of one of the local oscillator signals in accordance with said second control signal to ensure that the local oscillator signals are in phase quadrature.

3. A circuit as defined in claim 2, wherein said sweep signal applying means includes means for sweeping the signal with a bandwidth which is less than the bandwidth of said coherent receiver channels.

4. A circuit as defined in claim 3, wherein said phase controlling means comprises a variable phase shifter.

5. A circuit as defined in claim 4, wherein said amplitude controlling means and said phase controlling means each include a sample and hold circuit for sampling and holding their respective control signals generated in response to a predetermined frequency in said sweep signal from said sweep signal applying means; and a switch for applying their respective control signals generated in response to said predetermined frequency for controlling the amplitude level in one of said receiver channels and for controlling the phase of one of the local oscillator signals.

6. A circuit as defined in claim 5, further comprising a first switch disposed in said first channel after said first mixer and a second switch disposed in said second channel after said second mixer for applying the signals from said mixers to further processing circuits or to said first and second envelope detectors and said adding means and said second subtracting means.

7. A circuit as defined in claim 6, wherein said sweep signal applying means includes means for applying a sweep signal which has the local oscillator frequency centered in the sweep.

8. A method for aligning the phase and amplitude of a first and second coherent receiver channels with said first receiver channel including a first mixer for mixing a first channel signal with a first local oscillator signal, and with a second receiver channel including a second mixer for mixing a second channel signal with a second local oscillator signal which is approximately 90° out of phase with said first local oscillator signal, comprising the steps of:

applying a sweep frequency signal to each of said receiver channels, with said sweep signal sweeping in frequency across a frequency band of interst;

detecting the envelope signals at the outputs of said first and second mixers;

subtracting the detected envelopes from said first and second mixers from each other and generating a first control signal in accordance therewith;

controlling the amplitude in one of said receiver channels in accordance with said first control signal;

adding the output signals from said first and second mixers to obtain a sum signal;

detecting the envelope signal of said sum signal;

subtracting the output signals from said first and second mixers from each other to obtain a difference signal;

detecting the envelope of said difference signal;

subtracting the envelopes of said sum and difference signals from each other and generating a second control signal in accordance therewith; and controlling the phase of one of the local oscillator signals in accordance with said second control signal to ensure that the local oscillator signals are in phase quadrature.

9. A method as defined in claim 8, wherein said sweep frequency applying step includes the step of sweeping the signal with a bandwidth which is less than the bandwidth of said coherent receiver channels.

10. A method as defined in claim 9, wherein said amplitude controlling step and said phase controlling step include the steps of sampling and holding their respective control signals generated in response to a predetermined frequency in said sweep signal; and switching at a predetermined time these sampled and held control signals to control the amplitude level in one of said receiver channels and to control the phase of one of the local oscillator signals.

* * * * *